United States Patent [19]
Ren

[11] 4,153,994
[45] May 15, 1979

[54] NINETY DEGREE PHASE STEPPER

[75] Inventor: Chung-Li Ren, Andover, Mass.

[73] Assignee: Bell Telephone Laboratories, Incorporated, Murray Hill, N.J.

[21] Appl. No.: 878,561

[22] Filed: Feb. 17, 1978

[51] Int. Cl.[2] .......................... H01P 1/18; H01P 5/12; H03H 7/18; H01P 1/38

[52] U.S. Cl. .................................... 333/157; 325/369; 333/103; 333/121

[58] Field of Search ...................... 333/31 R, 31 A, 11, 333/1.1, 98 R, 1, 7 R, 7 D; 325/366, 367, 369, 370, 372

[56] References Cited

U.S. PATENT DOCUMENTS

| | | | |
|---|---|---|---|
| 2,786,133 | 3/1957 | Dyke | 325/369 |
| 3,058,071 | 10/1962 | Walsh et al. | 333/11 |
| 3,419,823 | 12/1968 | Seidel | 333/11 |
| 3,582,790 | 6/1971 | Curtis | 333/369 |
| 3,996,533 | 12/1976 | Lee | 333/7 R |
| 4,088,970 | 5/1978 | Fasset et al. | 333/31 R |

*Primary Examiner*—Alfred E. Smith
*Assistant Examiner*—Marvin Nussbaum
*Attorney, Agent, or Firm*—Sylvan Sherman

[57] ABSTRACT

A 90 degree phase stepper is described comprising a tandem array of three, 3 db hybrid couplers where the first and third couplers are of one variety (either 90 degree or 180 degree couplers) and the second is of the other variety. A pair of variable phase shifters are located in the two wavepaths connecting the first and second couplers, and a single variable phase shifter is included in one of the two wavepaths connecting the second and third couplers. Each phase shifter introduces either a zero or a 180 degree phase shift. By the appropriate selection of phase shifts, the phase of the output signal can be stepped in 90 degree increments. The stepper is designed for use in the signal combining circuit of a space diversity system. It is an advantage of the circuit that all of the received signal is preserved.

6 Claims, 2 Drawing Figures

NINETY DEGREE PHASE STEPPER

TECHNICAL FIELD

This invention relates to phase shifters capable of producing continuously steppable phase shifts of 90 and 180 degrees in either direction.

Background Art

It is well known that radio waves, propagating from a transmitter to a receiver, can follow a plurality of different paths and that the relative phases of the waves arriving at the receiving antenna can be such as to destructively interfere, causing what is commonly referred to as a fade. In order to reduce the opportunity for this to occur, the so-called "space diversity" system has been developed using two, spaced antennas to feed a common receiver. The theory underlying the use of two spaced-apart antennas is that there is less likelihood that a fade will occur at both antennas at the same time. In the simplest system, means are provided for disconnecting the receiver from the antenna as soon as the received signal falls below a predetermined threshold level, and for connecting the receiver to the second antenna. In this so-called "blind switch" it is assumed that the signal received by the second antenna will be stronger than that received by the first antenna. In a more sophisticated system, the signals from the two antennas are combined at radio frequency instead of merely selecting the larger of the two. This eliminates amplitude and phase jumps associated with the switching operation, and has the added advantage of delivering a larger amplitude signal to the receiver. However, such a system requires the use of dynamic phase correction to compensate for variations in the relative phase of the two signals caused by changes in their path lengths. One such system, described in U.S. Pat. No. 2,786,133, a single, continuously adjustable phase shifter is included in one of the antenna wavepaths and is automatically adjusted so that the wave from the one antenna has the proper phase to combine with the wave from the other antenna. U.S. Pat. No. 3,582,790 shows, in greater detail, a means for combining the two received signals and for isolating the two antennas from each other. The circuit includes a first phase shifter which shifts the phase of one of the input signals to bring it into quadrature phase relationship with the other. The quadrature related signals are combined in a first hybrid coupler to produce a pair of equal amplitude signals. The phase of one of the two signals is then shifted 90 degrees by a second phase shifter so as to bring the two signals in phase. The two equal, in-phase signals are then combined in a second hybrid coupler to produce a single output signal whose total power is equal to the sum of the powers of the two received signals.

Both of these systems seek to track the two signals continuously and do so by means of continuously variable phase shifters. The problem with such phase shifters is that in order to go from maximum phase shift back to zero, it is necessary to go through all values therebetween. To illustrate the problem, consider two waves whose relative phase difference is slowly increasing. As the phase increases, it will eventually reach 360 degrees at which point the two signals are again in phase. However, a phase shifter such as the type illustrated in U.S. Pat. No. 2,786,133 does not ease past its maximum phase shift to zero phase shift but, instead, must be reset by going completely through its entire range of phase shift from its maximum setting to its minimum setting, causing a sudden fluctuation in the amplitude of the output signal, including the possibility of signal cancellation. What is desired is a phase shifter which is capable of providing increasing or decreasing phase shifts without a return-toward-zero requirement.

The return-toward-zero problem is also present in other types of continuously variable phase shifters. For example, U.S. Pat. No. 3,419,823 shows a phase shifter comprising a tandem array of a 90 degree hybrid coupler and a 3 dB, 180 degree hybrid coupler. In this embodiment, the phase of the output signal is controlled by either changing the power division ratio of the 90 degree coupler, or by changing the attenuation in one of the two wavepaths connecting the two couplers. In either case, the return-toward-zero problem is not resolved by the phase shifter described in this patent.

Before discussing the present invention, mention should be made of the switching system disclosed in U.S. Pat. No. 3,058,071. While the function of this system is to switch an input signal between one of two output paths, rather than produce a variable phase shift, the circuit is similar to a phase shifter in accordance with the present invention, as will be described hereinbelow. Specifically, the switch comprises a tandem array of three, 3 dB hybrid couplers, including variable phase shifters in the two wavepaths connecting the first and second of the couplers. By varying the phase shift between zero and 90 degrees, the output of the switch can be controlled. However, as noted hereinabove, this circuit is designed to control the amplitude, not the phase of the output signal.

SUMMARY OF THE INVENTION

A 90 degree phase stepper in accordance with the present invention comprises a tandem array of three, 3 dB hybrid couplers where the first and third couplers in the array are of one variety (either 90 degree or 180 degree couplers) and the second coupler is of the other variety (either a 180 degree or a 90 degree coupler). A variable phase shifter is located in each of the two wavepaths connecting the first and second couplers, and a single variable phase shifter is included in one of the two wavepaths connecting the second and third couplers.

Each of the phase shifters introduces a differential phase shift of either zero or 180 degrees. By the appropriate selection of phase shifts, the phase of the output signal can be stepped continuously, in either direction, in 90 degree increments.

An advantage of the present invention over the phase stepper disclosed in the copending application, Ser. No. 878,528, by H. Miedema, filed concurrently with the instant application, is that none of the input signal power is inherently lost. By contrast, half of the signal power is lost in the stepper disclosed in the copending application.

DETAILED DESCRIPTION

Figure 1:
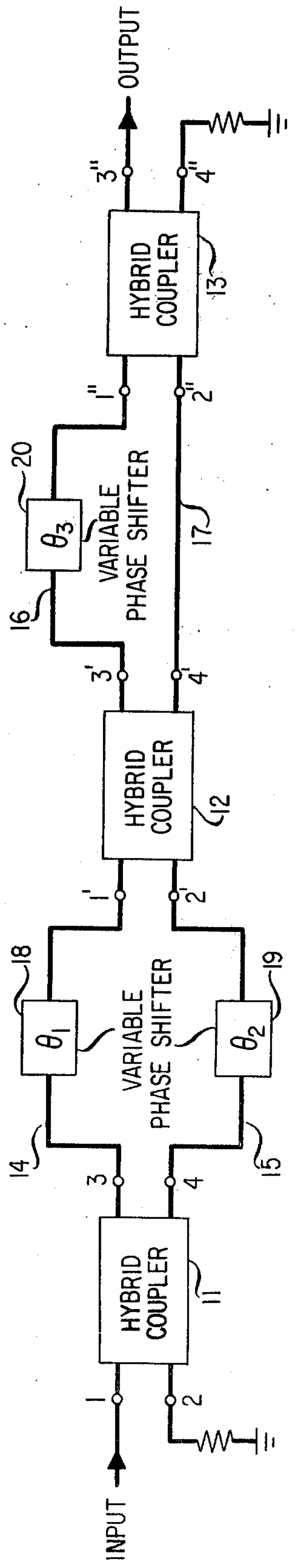
FIG. 1 shows in block diagram, a 90 degree phase stepper in accordance with the present invention.

Referring to the drawings, FIG. 1 shows a 90 degree phase stepper in accordance with the present invention comprising a tandem array of three, 3 dB hybrid couplers 11, 12 and 13, where each of the two wavepaths 14 and 15 connecting couplers 11 and 12 includes a variable phase shifter 18 and 19, respectively, and where one of the wavepaths 16 connecting couplers 12 and 13 includes a variable phase shifter 20.

The term "3 dB hybrid coupler" refers to that class of power dividing network having two pairs of conjugate branches 1–2 and 3–4 wherein the power of an incident signal applied to one branch of one pair of conjugate branches divides equally between the branches of the other pair of conjugate branches, with none of the incident power appearing at the fourth branch. In a 90 degree coupler, the phases of the signals in the two branches differ by 90 degrees. A 180 degree coupler, on the other hand, is characterized by an inherent asymmetry such that the signals in the two branches are either in-phase or 180 degrees out-of-phase, depending upon which branch is energized. In a "tandem array," the branches of one pair of conjugate branches of one of the couplers are connected, respectively, to the branches of one pair of conjugate branches of the next adjacent coupler in the array. Thus, in the illustrative embodiment of FIG. 1, conjugate branches 3–4 of the first coupler 11 are connected to conjugate branches 1′–2′ of the second coupler in the array by means of wavepaths 14 and 15. Similarly, conjugate branches 3′–4′ of coupler 12 are connected to conjugate branches 1″–2″ of the third coupler 13 by means of wavepaths 16 and 17. In addition, the first coupler 11, serving as the input coupler, and the last coupler 13, serving as the output coupler, are of the same type, i.e., either 90 degree or 180 degree couplers, whereas the intermediate coupler 12 is of the other type. Thus, if couplers 11 and 13 are 90 degree type couplers, coupler 12 would be a 180 degree type coupler. Conversely, if couplers 11 and 13 are 180 degree type couplers, coupler 12 would be a 90 degree type coupler.

In the case where couplers 11 and 13 are 90 degree couplers, a unit amplitude signal applied to branch 1 of coupler 11 produces signals $E_{3''}$ and $E_{4''}$ at branches 3″ and 4″, respectively, of output coupler 13 given by $$E_{3''}=\frac{-1}{2\sqrt{2}}\{-(e^{j\theta_1}+e^{j(\theta_2+\theta_3)})+j(e^{j\theta_2}+e^{j(\theta_1+\theta_3)})\} \quad (1)$$

$$E_{4''}=\frac{1}{2\sqrt{2}}\{(e^{j\theta_2}-e^{j(\theta_1+\theta_3)})+j(e^{j\theta_1}-e^{j(\theta_2+\theta_3)})\} \quad (2)$$

Table I is a listing of the phase sequence for $\theta_1$, $\theta_2$ and $\theta_3$ defined to obtain 90 degree phase stepping and full power transmitted to output branch 3″, i.e., $E_{4''}=0$.

TABLE I

| $\theta_1$ | $\theta_2$ | $\theta_3$ | $E_{3''}$ |
|---|---|---|---|
| 0° | 0° | 0° | $1\angle 315°$ |
| 0° | 180° | 180° | $1\angle 45°$ |
| 180° | 180° | 0° | $1\angle 135°$ |
| 180° | 0° | 180° | $1\angle 225°$ |

In the case where couplers 11 and 13 are 180 degree couplers, a unit amplitude input signal produces output signal $E'_{3''}$ and $E'_{4''}$ given by $$E'_{3''}=-E_{3''} \quad (3)$$

and $$E'_{4''}=jE_{4''} \quad (4)$$

Table II is a listing of phase sequences for this second case.

TABLE II

| $\theta_1$ | $\theta_2$ | $\theta_3$ | $E_{3''}$ |
|---|---|---|---|
| 0° | 0° | 0° | $1\angle 135°$ |
| 0° | 180° | 180° | $1\angle 225°$ |
| 180° | 180° | 0° | $1\angle 315°$ |
| 180° | 0° | 180° | $1\angle 45°$ |

It will be noted from Tables I and II that the phase of the output signal can be changed continuously, in either direction, in 90 degree increments by the appropriate combination of $\theta_1$, $\theta_2$ and $\theta_3$.

Figure 2:
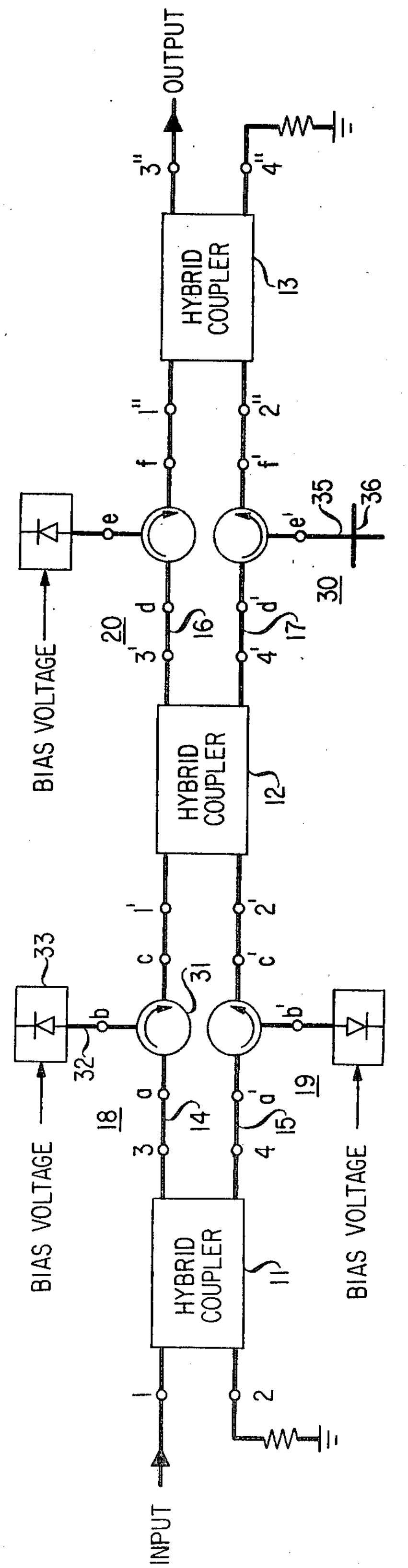
FIG. 2 shows a specific embodiment of the invention using a particular type of differential phase shifter.

FIG. 2 shows a specific embodiment of the invention wherein each of the variable phase shifters 18, 19 and 20 comprises a circulator, a length of transmission line and a PIN diode. Referring more particularly to phase shifter 18, a three-port circulator 31 is disposed in wavepath 14 such that the circulator input port a is connected to branch 3 of coupler 11; intermediate circulator port b is connected to a length of transmission line 32 that is terminated by means of PIN diode 33; and output circulator port c is connected to branch 1′ of coupler 12.

In operation, a signal applied to circulator port a leaves the circulator at port b, traverses the length of line 32 and is reflected back to the circulator by the diode. The reflected signal reenters the circulator at port b and exits from port c. The total phase shift through this circuit depends upon the length of transmission line 32 and the state of conduction of diode 33. In particular, the phase shift differs by 180 degrees, depending upon whether the diode is in a low conduction state, i.e., appears as an open circuit, or a high conduction state, i.e., appears as a short circuit. Thus, by controlling the conduction state of the diode by means of an externally applied bias voltage, a differential phase shift of 180 degrees can be obtained. The bias voltage can either be controlled manually, or automatically in response to some monitored parameter.

To compensate for the fixed amount of phase shift introduced in wavepath 16 by variable phase shifter 20, a fixed phase shifter 30 is included in wavepath 17. This phase shifter is essentially the same as variable phase shifter 20 in wavepath 16 except that the length of transmission line 35 is terminated by means of a sliding short circuit 36 instead of a diode. The short circuit is adjusted to compensate for the fixed amount of phase shift in variable phase shifter 20.

What is claimed is:

1. A phase stepper comprising:

a tandem array of 90 degree type and 180 degree type 3 dB hybrid couplers, each of which has two pairs of conjugate branches;

the first and third couplers in said array being of the same type;

the second coupler in said array being of the other type;

first and second variable phase shifters connecting one pair of conjugate branches of the first coupler to one pair of conjugate branches of the second coupler;

and a pair of wavepaths connecting the second pair of conjugate branches of the second coupler to one pair of conjugate branches of the third coupler;

CHARACTERIZED IN THAT:

said first and second phase shifters introduce differential phase shifts of either zero of 180 degrees;

and in that a third variable phase shifter for introducing a differential phase shift of either zero or 180 degrees is included in one of the wavepaths connecting said second and third couplers.

2. The phase stepper according to claim 1 wherein the first and third couplers are 90 degree hybrid couplers; and said second coupler is a 180 degree hybrid coupler.

3. The phase stepper according to claim 1 wherein said first and third couplers are 180 degree couplers; and said second coupler is a 90 degree coupler.

4. The phase stepper according to claim 1 wherein a phase shifter is included in the other wavepath connecting said second and third couplers for introducing a fixed amount of phase shift equal to the fixed amount of phase shift in said one wavepath.

5. The phase stepper according to claim 1 wherein each variable phase shifter comprises:

a circulator having a first port connected to a branch of one hybrid coupler;

a second port connected to a length of transmission line terminated by means of a PIN diode;

and a third port connected to a branch of the next adjacent coupler in said array.

6. The stepper according to claim 5 including means for switching said PIN diode between a high and a low conductivity state.

* * * * *